(12) United States Patent
Zambrano et al.

(10) Patent No.: US 7,052,985 B2
(45) Date of Patent: May 30, 2006

(54) CONTACT STRUCTURE FOR AN INTEGRATED SEMICONDUCTOR DEVICE

(75) Inventors: Raffaele Zambrano, Viagrande (IT); Cesare Artoni, Augusta (IT); Chiara Corvasce, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/804,492

(22) Filed: Mar. 18, 2004

(65) Prior Publication Data

US 2004/0175927 A1    Sep. 9, 2004

Related U.S. Application Data

(62) Division of application No. 10/126,939, filed on Apr. 18, 2002, now Pat. No. 6,734,565.

(30) Foreign Application Priority Data

Apr. 19, 2001  (WO) ................. PCT/IT01/00192

(51) Int. Cl.
*H01L 21/4763* (2006.01)
*H01L 21/44* (2006.01)
(52) U.S. Cl. ................. 438/619; 438/622; 438/685
(58) Field of Classification Search ................. 438/319, 438/411, 421–422, 619, 622, 685
See application file for complete search history.

(56) References Cited

U.S. PATENT DOCUMENTS

| 5,475,248 | A | 12/1995 | Takenaka | 257/295 |
|---|---|---|---|---|
| 5,481,490 | A | 1/1996 | Watanabe et al. | 365/145 |
| 5,578,867 | A | 11/1996 | Argos, Jr. et al. | 257/632 |
| 5,638,319 | A | 6/1997 | Onishi et al. | 365/145 |
| 5,716,875 | A | 2/1998 | Jones, Jr. et al. | 438/3 |
| 5,750,419 | A | 5/1998 | Zafar | 438/3 |
| 5,811,847 | A | 9/1998 | Joshi et al. | 257/296 |
| 5,864,153 | A | 1/1999 | Nagel et al. | 257/296 |
| 5,956,594 | A | 9/1999 | Yang et al. | 438/396 |

(Continued)

FOREIGN PATENT DOCUMENTS

DE    196 40 246 A1    4/1998

(Continued)

OTHER PUBLICATIONS

Yamazaki, T. et al., "Advanced 0.5 μm FRAM Device Technology with Full Compatibility of Half-Micron CMOS Logic device," IEEE, pp. 25.5.1-25.5.4, XP000855871, Dec. 1997.

*Primary Examiner*—Ha Tran Nguyen
(74) *Attorney, Agent, or Firm*—Lisa K. Jorgenson; Robert Iannucci; Seed IP Law Group PLLC

(57) ABSTRACT

A process forms an integrated device having: a first conductive region; a second conductive region; an insulating layer arranged between the first and the second conductive region; at least one through opening extending in the insulating layer between the first and the second conductive region; and a contact structure formed in the through opening and electrically connecting the first conductive region and the second conductive region. The contact structure is formed by a conductive material layer that coats the side surface and the bottom of the through opening and surrounds an empty region which is closed at the top by the second conductive region. The conductive material layer preferably comprises a titanium layer and a titanium-nitride layer arranged on top of one another.

32 Claims, 3 Drawing Sheets

U.S. PATENT DOCUMENTS

| | | | |
|---|---|---|---|
| 5,965,942 A | 10/1999 | Itoh et al. | 257/761 |
| 5,973,342 A | 10/1999 | Nakamura | 257/295 |
| 5,981,382 A | 11/1999 | Konecni et al. | 438/646 |
| 5,990,507 A | 11/1999 | Mochizuki et al. | 257/295 |
| 5,994,153 A | 11/1999 | Nagel et al. | 438/3 |
| 5,998,296 A | 12/1999 | Saran et al. | 438/685 |
| 6,037,252 A | 3/2000 | Hillman et al. | 438/637 |
| 6,043,529 A | 3/2000 | Hartner et al. | 257/306 |
| 6,051,858 A | 4/2000 | Uchida et al. | 257/295 |
| 6,075,264 A | 6/2000 | Koo | 257/295 |
| 6,091,599 A | 7/2000 | Amamiya | 361/306.3 |
| 6,121,083 A | 9/2000 | Matsuki | 438/254 |
| 6,180,974 B1 | 1/2001 | Okutoh et al. | 257/306 |
| 6,194,311 B1 | 2/2001 | Nakajima | 438/660 |
| 6,197,631 B1 | 3/2001 | Ishihara | 438/240 |
| 6,239,460 B1 | 5/2001 | Kuroiwa et al. | 257/300 |
| 6,281,537 B1 | 8/2001 | Kim | 257/295 |
| 6,313,539 B1 | 11/2001 | Yokoyama et al. | 257/761 |
| 6,355,545 B1 * | 3/2002 | Ohba | 438/570 |
| 6,376,369 B1 * | 4/2002 | Doan | 438/643 |
| 6,436,829 B1 * | 8/2002 | Layadi et al. | 438/691 |

FOREIGN PATENT DOCUMENTS

| | | |
|---|---|---|
| EP | 0 793 274 A1 | 9/1997 |
| EP | 0 837 504 A2 | 4/1998 |
| EP | 0 996 160 A1 | 4/2000 |
| WO | WO 98/05071 | 2/1998 |

* cited by examiner

CONTACT STRUCTURE FOR AN INTEGRATED SEMICONDUCTOR DEVICE

CROSS-REFERENCE TO RELATED APPLICATION

This application is a divisional of U.S. patent application Ser. No. 10/126,939, filed Apr. 18, 2002, now U.S. Pat. No. 6,734,565, which application is incorporated herein by reference in its entirety.

BACKGROUND OF THE INVENTION

1. Field of the Invention

The present invention relates to a contact structure for integrated semiconductor devices and to a fabrication process thereof.

More specifically, the invention relates to a contact structure for a ferro-electric memory device integrated in a semiconductor substrate and of the type comprising an appropriate control circuitry and an array of ferro-electric memory cells.

The invention regards, in particular, but not exclusively, a ferro-electric memory device of the "stacked" type, and the ensuing description is made with reference to this application with the sole purpose of simplifying the presentation of the invention. In fact, the stacked configuration is particularly suited to the integration requirements of the new CMOS technologies.

2. Description of the Related Art

In a stacked photo-electric memory device, each memory cell includes a MOS transistor integrated in a substrate of semiconductor material and connected to a ferro-electric capacitor arranged on top of the MOS transistor.

The MOS transistor comprises a first and a second conduction terminal (source and drain regions), formed in the substrate, and a control electrode, formed on top of the substrate inside an insulating layer that covers the substrate. The ferro-electric capacitor comprises a bottom electrode made on the insulating layer, above and in electrical contact with the first conduction terminals. The bottom electrode is coated with a ferro-electric material layer and is capacitively coupled to a top electrode.

As is well known, ferro-electric memories are starting to play an ever important role in the panorama of integrated circuits, thanks to their low consumption, as well as to the high read and erasing speeds as compared to conventional nonvolatile memories.

Consequently, it is of great interest to be able to build ferro-electric memory devices in combination with MOS devices integrated in a same semiconductor substrate.

The known processes for the implementation of ferro-electric memory devices envisage, after forming the conduction terminals of the MOS transistor in the substrate, forming the insulating layer which covers the entire surface of the chip.

The control electrode is formed inside the insulating layer, and then, on top of the insulating layer, the ferro-electric capacitor is formed.

The article "Advanced 0.5 µm FRAM Device Technology with Full Compatibility of Half-Micron CMOS Logic Devices" by Yamazaki et al. (Proceedings of IEDM '97, Washington, D.C., December 1997) describes a first known solution for implementing ferro-electric devices and the corresponding contacts.

In particular, the aforesaid article describes the manufacture of contacts intended to electrically connect ferro-electric devices and MOS devices through contact regions. The contact regions are formed by opening openings in the insulating layer and filling them with a conductive material, such as tungsten (W).

This technique, referred to as the W-plug technique, enables forming contacts with high aspect ratio, namely, a high contact depth-to-width ratio, but it is not easy to use when the W-plugs are to undergo, in subsequent process steps, heat treatments in an oxidizing environment.

This is the case of ferro-electric materials. The treatment of these materials envisages, in fact, after depositing the ferro-electric material, annealing and crystallization treatments at temperatures of between 500° C. and 850° C. in the presence of oxygen.

These treatments constitute, however, a problem. In fact, tungsten, reacting with oxygen ($O_2$), is converted into tungsten pentoxide ($W_2O_5$), i.e., a non-conductive material, according to a strongly exothermic process. This phenomenon, known as a "volcano" phenomenon, may even cause explosion of the contact as a result of the formation of $W_2O_5$, and moreover involves the risk of polluting the oxidation oven. Similar considerations apply in the case where the contact regions are filled with polysilicon (polySi-plugs), which oxidizes and becomes insulating if it is subjected to the treatments necessary for the crystallization of ferro-electric materials.

More specifically, the polysilicon, reacting with oxygen, is converted into silicon dioxide ($SiO_2$), namely into a non-conductive material, according to a process that involves an increase in volume, and hence high stress induced on the structure. To solve this problem, the contacts filled with tungsten or polysilicon are "sealed" with barrier layers made of materials that are not standard in processes for manufacturing integrated circuits.

The introduction of the process steps for forming the barrier layers is at the expense of a considerable complication in the fabrication process.

The device described in the cited document has an interconnection with the MOS device obtained through a titanium-nitride (TiN) layer used as a local interconnection.

European patent application EP 0996160 filed in the name of the present applicant on 12 Oct. 1998, and incorporated herein by reference in its entirety, discloses forming a contact structure for a semiconductor device using (FIG. 1) a Ti/TiN barrier layer, deposited before the plugs, in order to ensure conduction between the terminals of the MOS transistor ($N^+$-type or $P^+$-type junctions) and a capacitor overlying the insulating layer. The remaining space is filled with silicon dioxide ("oxide plugs").

This solution makes it possible to avoid the problem of "volcanoes" described previously.

The above solution involves, however, an increase in the contact resistance with respect to the structure filled with tungsten. Although this drawback does not constitute a problem for biasing the capacitor, and hence for the memory device, it may impair the performance of the control circuits.

Even though these solutions are advantageous, the fabrication process is rendered burdensome by the steps of filling the contact and of subsequent planarization or etching of the residual oxide.

BRIEF SUMMARY OF THE INVENTION

An embodiment of the present invention provides a process able to avoid the drawbacks described previously, and hence provides a contact structure for a semiconductor device, in particular of the ferro-electric type, having structural and functional characteristics such as to overcome the limitations and drawbacks that still afflict the known devices, in particular as regards the contact structures.

BRIEF DESCRIPTION OF THE DRAWINGS

For a better understanding of the present invention, a preferred embodiment is now described, purely by way of non-limiting example and with reference to the attached drawings, wherein.

DETAILED DESCRIPTION OF THE INVENTION

European patent application No. 00830762.1, filed in the name of the present applicant and incorporated herein by reference in its entirety, solves the problem referred to above by differentiating the use of the oxide plugs and the tungsten plugs, according to two possible solutions:

a) using the oxide plugs for the contact between the source region of the MOS transistor and the bottom electrode of the ferro-electric capacitor (in the memory array), and the tungsten plugs for the contact with the drain region of the MOS transistor and for all the contacts of the CMOS components of the circuitry;

b) using the oxide plugs for both the contacts of the terminals of the MOS transistor (both between the source region and the bottom electrode of the capacitor—in the memory array—and between the drain region and the metal region of the bit line), and the tungsten plugs for all the contacts of the CMOS components of the circuitry.

Figure 1:
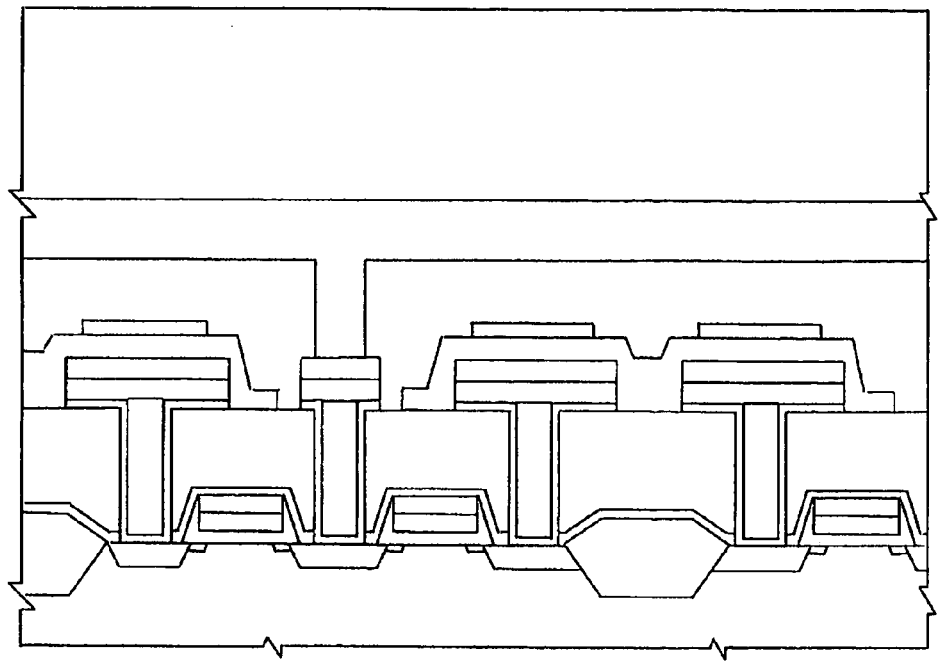
FIG. 1 shows a cross-section of a portion of a known ferro-electric memory array.
Figure 2:
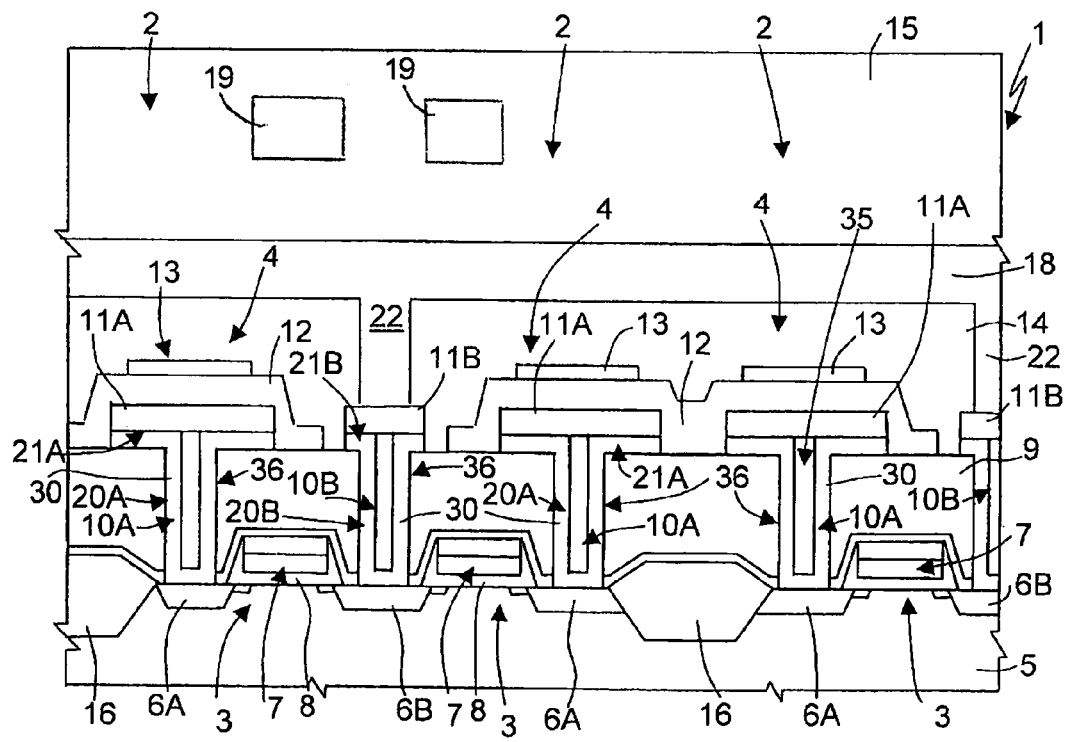
FIG. 2 shows a cross-section of a ferro-electric memory array comprising the contact structure according to the invention.

FIG. 2 shows a portion of a memory array 1 of ferro-electric type, integrated in a substrate 5 of semiconductor material and comprising some memory cells 2.

Each memory cell 2 comprises, in particular, a MOS transistor 3, as well as a ferro-electric capacitor 4 connected thereto in series.

The memory cells 2 of the memory array 1 are, in a known way, organized in word lines WL and bit lines BL, each cell 2 being identified uniquely by the intersection of a bit line with a word line.

Each MOS transistor 3 is formed in the substrate 5 and comprises respective source regions 6A and drain regions 6B, $N^+$-type or $P^+$-type doped.

In addition, a control-gate electrode 7, formed by a double polysilicon and silicide layer, overlies a channel region of the substrate 5, the channel region being comprised between the source region 6A and the drain region 6B, and is insulated from the surface of the substrate 5 by a thin oxide layer 8. In this configuration, pairs of transistors 3 that are adjacent and belong to the same bit line BL have a common drain terminal 6B.

A first insulating layer 9, for example an oxide doped with boron and phosphorus (BPSG), coats the substrate 5. Openings 36 are formed in the first insulating layer 9, above the source region 6A and drain region 6B and accommodate respective contacts 10A, 10B.

Figure 3:
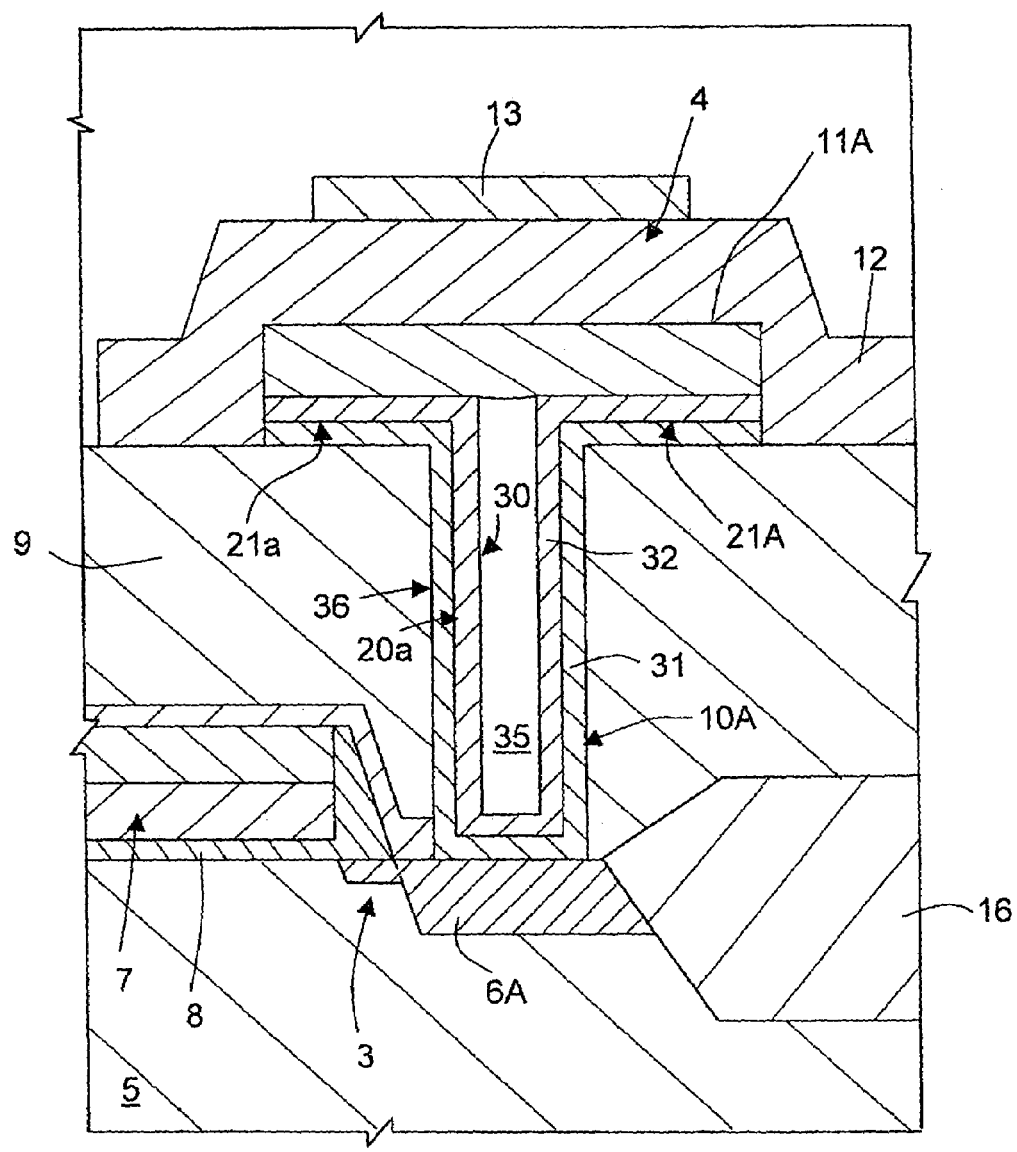
FIG. 3 shows an enlarged detail of FIG. 2.

The contacts 10A, 10B are of a conductive material layer 30 comprising a titanium layer 31 and a titanium-nitride layer 32, arranged on top of one another (see FIG. 3). The contacts 10A, 10B each comprise a coating portion 20A, 20B which coats the side walls and the bottom of the opening 36 of the first insulating layer 9, and a horizontal portion 21A, 21B, which extends on top of the first insulating layer 9. The region or volume 35 inside each coating portion 20A, 20B of the contacts 10A, 10B is empty.

First and second conductive regions 11A, 11B, for example of platinum, cover the horizontal portions 21A and 21B of the contacts 10A, 10B and seal the contacts 10A, 10B at the top. The first conductive regions 11A form a bottom plate of the ferro-electric capacitors 4 and extend, at least partially, over the control electrode 7 of the transistor 3.

Each capacitor 4 moreover comprises a ferro-electric material region 12 and a top plate 13. The ferro-electric material regions 12 form strips that extend, in a direction perpendicular to the plane of the drawing (as described in Italian patent application TO99A000356 filed on 30 Apr. 1999, corresponding to U.S. application Ser. No. 09/998, 602, which is incorporated herein by reference in its entirety), on top of and between pairs of adjacent first conductive regions 11A that belong to two memory cells 2 that do not have the drain region 11B in common.

The top electrodes 13 are formed by strips of metal, for example platinum, which extend, perpendicularly to the plane of the drawing, on top of the ferro-electric material regions 12. In particular, the top electrodes 13 have a smaller width than the first conductive regions 11A forming the bottom electrodes of the ferro-electric capacitors 4, as may be seen in the cross-section of FIG. 2.

On top of the ferro-electric capacitors 4 there extend in succession a second insulating layer 14, a first metal line 18 (Metal 1), which forms a bit line and extends in the horizontal direction of the drawing, a third insulating layer 15, and second metal lines 19 (Metal 2), that form word lines and extend in a direction perpendicular to the plane of the drawing, inside the third insulating layer 15. Contact regions 22 extend through the second insulating layer 14, between the first metal line 18 and the second conductive regions 11B, to electrically connect the first metal line 18 to the drain regions 6B through the second conductive regions 11B and the second contacts 10B.

The structure of FIG. 2 is obtained in the way described hereinbelow. Initially, thick oxide (field oxide) regions 16 are formed in the substrate 5 and define between them conduction areas or active areas of the ferro-electric memory device 1. Inside and on top of the active areas, the MOS transistor 3 is formed; namely, the thin oxide layer 8, the control-gate electrode 7, and the source regions 6A and drain regions 6B. In a per se known manner, not described in detail, the junctions ($P^+$ or $N^+$) of the source regions 6A and drain regions 6B can be possibly separated by oxide spacers. Also, the source and drain regions 6A, 6B are subsequently contacted through a contact structure according to an embodiment of the invention.

Next, the first insulating layer 9 is deposited on the substrate 5. In the first insulating layer 9, using a contact mask and a subsequent oxide etch, the openings 36 are made above the source regions 6A and drain regions 6B, so as to enable access to the substrate 5 through the first insulating layer 9. In one embodiment, the openings 36 are about 0.18–0.35 microns in width and 0.5 to 1.2 in depth. Of course, openings with other dimensions can be employed without departing from the invention.

Then the contact structure 10A, 10B is formed by depositing the conductive material layer 30.

In a possible implementation, as a non-limiting example, on top of the first insulating layer 9 is deposited the Ti layer 31, by plasma vapor deposition (PVD) or using another deposition technique. The PVD technique is non-conformal, and thus, deposits the Ti layer 31 more thinly (e.g., 10 nm) on the vertical walls of the openings 36 compared to the horizontal bottoms (e.g., 35 nm) of the openings. The TiN layer 32 is then deposited on the Ti layer by chemical vapor deposition (CVD) or using another deposition technique. The CVD technique is conformal, and thus, the TiN coats the vertical walls and horizontal bottoms of the openings in similar thicknesses and typically thicker than the Ti layer 31. For example, the Ti layer 31 has a thickness of between 10 and 100 nm, preferably 35 nm, and the TiN layer 32 has a thickness of between 50 and 200 nm, preferably 100 nm.

It is possible to form a titanium layer alone or a titanium nitride layer alone, even though it is preferable to have both layers.

Thereby, the conductive material layer 30 coats in an almost conform w ay the side walls and the bottom of the openings 36, forming the contacts 10A, 10B.

At this point, the region 35 comprised between the walls of the contacts 10A, 10B is left empty.

Next, a conductive layer, for example of platinum, is deposited in a non-conformal way, such as by PVD. After forming the conductive material layer 30, the openings 36 is much narrower than before, and thus, the conductive layer substantially does not succeed to reach the interiors of the openings 36. The conductive layer rapidly grows on the edges of the openings 36 so as to rapidly throttle or close the openings 36 and leave the empty regions 35. The conductive layer is shaped, together with the conductive material layer 30, so as to form simultaneously the horizontal portions 21A and 21B of the contacts 10A, 10B and the first and second conductive regions 11A, 11B.

From experimental tests it has been noted that the conductive layer that is to form the first and second conductive regions 11A, 11B seals the contacts 10A, 10B at the top, maintaining a sufficient planarization. It is, anyhow, preferable that the width of the empty region 35 be similar to (or slightly greater than) the width of the conductive material layer 30. Conduction between the $N^+$, $P^+$ junctions forming the source regions 6A and the drain regions 6B of the MOS transistor 3 and the conductive layer that is to form the first and second conductive regions 11A, 11B is thus ensured by the Ti/TiN conductive material layer 30, which, from the substrate 5, following the profile of the openings 36, reaches as far as the top surface of the first insulating layer 9.

Finally, the ferro-electric capacitor 4 is formed according to the process steps known in the current technology and described in Italian patent application TO99A000356 filed on 30 Apr. 1999, referred to previously.

The contact structure 10A, 10B described above solves the above discussed problems of the known structures. In addition, the elimination of process steps, such as tungsten deposition, which take place in presence of hydrogen, is advantageous from the standpoint of the quality of the ferro-electric material, in so far as the latter is degraded by hydrogen.

Figure 4:
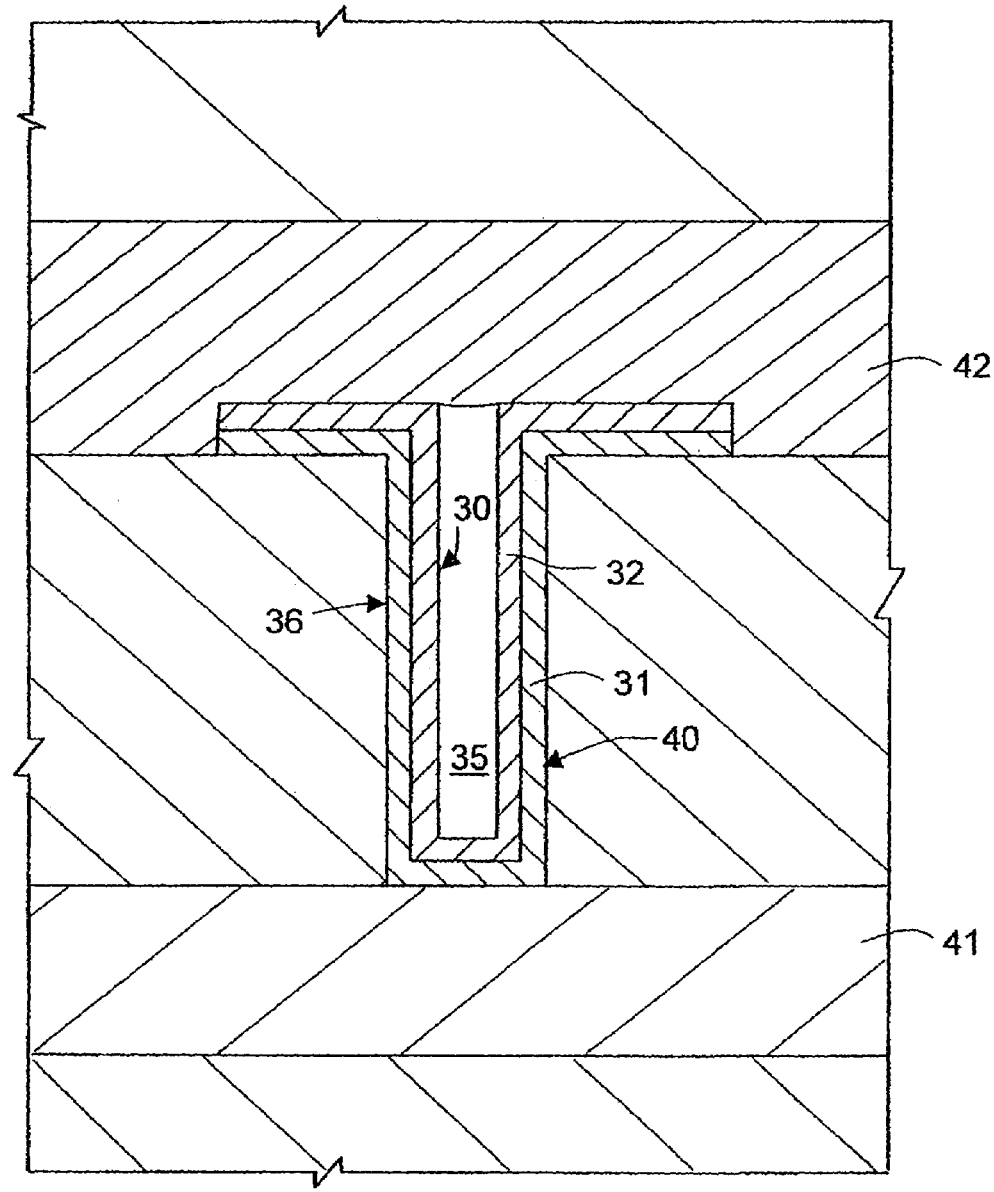
FIG. 4 shows a variant of the contact structure according to the invention.

Finally, it is clear that modifications and variations may be made to the device and the fabrication process described and illustrated herein, without thereby departing from the scope of the present invention, as defined in the attached claims. In particular, it is emphasized that the described contact structure can be used in any electronic device wherein it is necessary to electrically connect a first conductive region, wherever this is formed (either embedded in the substrate or surrounded by insulating layers on top of the substrate) with a second conductive region (for example, a metal region) arranged at a different level. In particular, the invention can be applied also to regions connecting successive metal layers, as shown by way of example in FIG. 4, for a contact structure 40 formed between a first metal line 41 and a second metal line 42.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

We claim:

1. A process for manufacturing an integrated device, comprising the steps of:
    forming a first conductive region;
    forming an insulating layer which coats said first conductive region;
    forming a through opening in said insulating layer above said first conductive region;
    forming a contact structure that covers sidewalls of said through opening and a portion of the first conductive region that defines a bottom of said through opening, said step of forming the contact structure comprising depositing a conductive material layer in a manner that simultaneously forms an empty region that is delimited by the conductive material layer and is open at a top end opposite to the bottom of said through opening; and
    without previously depositing a filling material in the empty region, forming a second conductive region that closes the top end of the empty region and delimits, together with the contact structure, the empty region.

2. The process for manufacturing an integrated device according to claim 1, wherein said conductive material layer is obtained by depositing a titanium layer.

3. The process for manufacturing an integrated device according to claim 2, wherein said titanium layer is deposited by PVD.

4. The process for manufacturing an integrated device according to claim 2 wherein said titanium layer has a thickness of between 10 and 100 nm.

5. The process for manufacturing an integrated device according to claim 1 wherein said conductive material layer is obtained by depositing a titanium-nitride layer.

6. The process for manufacturing an integrated device according to claim 5, wherein said titanium-nitride layer is deposited by CVD.

7. The process for manufacturing an integrated device according to claim 5 wherein said titanium-nitride layer has a thickness of between 50 and 200 nm.

8. The process for manufacturing an integrated device according to claim 1 wherein said step of forming said second conductive region comprises depositing conductive material in a non-conformal way over said region.

9. The process for manufacturing an integrated device according to claim 8, wherein said second conductive region contains platinum.

10. The process for manufacturing an integrated device according to claim 9 wherein said integrated device is a ferro-electric memory comprising a transistor and a ferro-electric capacitor; said step of forming a first conductive region comprises forming a first conduction region of said transistor in a substrate of semiconductor material; said step of forming an insulating layer comprises depositing insulating material on top of said substrate; and said step of forming a second conductive region comprises forming a first plate of said ferro-electric capacitor; the process further comprising forming a ferro-electric material region on top of said first plate, and forming a second plate of said ferro-electric capacitor on top of said ferro-electric material region.

11. A process for manufacturing an integrated device, comprising:
forming a first conductive region;
forming an insulating layer on the first conductive region;
forming a through opening in the insulating layer above the first conductive region;
forming a conductive material layer on walls of the through opening in a manner that simultaneously forms an empty region delimited by the conductive material layer and having a top opening that exposes the empty region, the conductive material layer contacting the first conductive region; and
without previously depositing a filling material in the empty region, forming a second conductive region that closes the top opening and defines, together with the conductive material layer, the empty region.

12. The process for manufacturing an integrated device according to claim 11 wherein said conductive material layer is obtained by depositing a titanium layer.

13. The process for manufacturing an integrated device according to claim 12, wherein said titanium layer is deposited by PVD.

14. The process for manufacturing an integrated device according to claim 12 wherein said titanium layer has a thickness of between 10 and 100 nm.

15. The process for manufacturing an integrated device according to claim 11 wherein said conductive material layer is obtained by depositing a titanium-nitride layer.

16. The process for manufacturing an integrated device according to claim 15 wherein said titanium-nitride layer is deposited by CVD.

17. The process for manufacturing an integrated device according to claim 15 wherein said titanium-nitride layer has a thickness of between 50 and 200 nm.

18. The process for manufacturing an integrated device according to claim 11 wherein the through opening has a width of about 0.18–0.35 microns, forming the conductive material layer includes forming a first conductive layer having a thickness between 10 and 100 nm and forming a second conductive layer having a thickness between 50 and 200 nm.

19. The process for manufacturing an integrated device according to claim 18 wherein the first conductive layer includes titanium and the second conductive layer includes titanium nitride.

20. The process for manufacturing an integrated device according to claim 11 wherein said integrated device is a ferro-electric memory comprising a transistor and a ferro-electric capacitor; said step of forming a first conductive region comprises forming a first conduction region of said transistor in a substrate of semiconductor material; said step of forming an insulating layer comprises depositing insulating material on top of said substrate; and said step of forming a second conductive region comprises forming a first plate of said ferro-electric capacitor; the process further comprising forming a ferro-electric material region on top of said first plate, and forming a second plate of said ferro-electric capacitor on top of said ferro-electric material region.

21. The process for manufacturing an integrated device according to claim 11, wherein the conductive material layer includes a top portion that extends on top of said insulating layer and the second conductive region extends on top of the top portion of the conductive material layer.

22. The process for manufacturing an integrated device according to claim 21, wherein the second conductive region does not extend into the through opening.

23. A process of making an integrated device, comprising:
forming a first conductive region;
forming an insulating layer on the first conductive region;
forming a through opening extending in the insulating layer;
forming a contact structure in the through opening, the contact structure comprising a conductive material layer and an empty region, the conductive material layer being electrically connected to the first conductive region and including a top opening that exposes the empty region; and
forming a conductive cover layer above the contact structure, the cover layer closing the top opening and the empty region,
wherein the conductive material layer is formed by steps including:
coating a side surface of the insulating layer, which laterally defines the through opening, with a coating portion of the conductive material layer which laterally defines the empty region; and
forming a horizontal portion of the conductive material layer that extends on top of the insulating layer and beneath the conductive cover layer.

24. The process of claim 23 wherein the conductive material has a side surface and a bottom surface that faces the first conductive region, and the empty region is surrounded by the conductive material layer.

25. The process of claim 23 wherein forming the conductive material layer includes depositing a titanium layer on a sidewall of the insulating layer which laterally defines the through opening and depositing a titanium nitride on the titanium layer, the titanium nitride layer laterally defining the empty region.

26. The process of claim 23 wherein forming the conductive material layer includes depositing a first conductive layer by PVD and depositing a second conductive layer by CVD.

27. The process of claim 23 wherein the through opening has a width of about 0.18–0.35 microns, forming the conductive material layer includes forming a first conductive layer having a thickness between 10 and 100 nm and forming a second conductive layer having a thickness between 50 and 200 nm.

28. The process of claim 27 wherein the first conductive layer includes titanium and the second conductive layer includes titanium nitride.

29. The process of claim 23 wherein the integrated device is a ferro-electric memory comprising a transistor and a ferro-electric capacitor; the step of forming a first conductive region comprises forming a first conduction region of the transistor in a substrate of semiconductor material; the step of forming an insulating layer comprises depositing insulating material on top of the substrate, and the step of forming the covering layer includes forming a ferro-electric material region; the process further comprising:
forming a second conductive region between the covering layer and the contact structure, the second conductive region forming a first plate of the ferro-electric capacitor; and
forming a second plate of the ferro-electric capacitor on top of the ferro-electric material region.

30. A process for manufacturing an integrated device, comprising the steps of:

forming a first conductive region;

forming an insulating layer which coats said first conductive region;

forming a through opening in said insulating layer above said first conductive region;

forming a contact structure that covers sidewalls of said through opening and a portion of the first conductive region that defines a bottom of said through opening, the contact structure comprising a conductive material layer delimiting an empty region that is open at a top end opposite to the bottom of said through opening; and without previously depositing a filling material in the empty region, forming a second conductive region that closes the top end of the empty region and delimits, together with the contact structure, the empty region, wherein the conductive material layer of the contact structure includes a top portion that extends on top of said insulating layer and the second conductive region extends on top of the top portion of the conductive material layer.

31. The process for manufacturing an integrated device according to claim 30, wherein the second conductive region does not extend into the through opening.

32. The process for manufacturing an integrated device according to claim 30, wherein forming the contact structure includes depositing the conductive material layer in a manner that simultaneously forms the empty region that is open at a top end.

* * * * *

UNITED STATES PATENT AND TRADEMARK OFFICE
CERTIFICATE OF CORRECTION

PATENT NO. : 7,052,985 B2
APPLICATION NO. : 10/804492
DATED : May 30, 2006
INVENTOR(S) : Raffaele Zambrano et al.

It is certified that error appears in the above-identified patent and that said Letters Patent is hereby corrected as shown below:

Title Page
Item (62) should read as --Division of application No. 10/126,936...--.

Signed and Sealed this

Thirty-first Day of July, 2007

JON W. DUDAS
*Director of the United States Patent and Trademark Office*